(12) United States Patent
Chevalier et al.

(10) Patent No.: US 10,453,919 B2
(45) Date of Patent: Oct. 22, 2019

(54) HETEROJUNCTION BIPOLAR TRANSISTOR WITH COUNTER-DOPED COLLECTOR REGION AND INCREASE COLLECTOR DEPENDENT BREAKDOWN VOLTAGE

(71) Applicant: STMicroelectronics (Crolles 2) SAS, Crolles (FR)

(72) Inventors: Pascal Chevalier, Chapareillan (FR); Alexis Gauthier, Meylan (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/803,959

(22) Filed: Nov. 6, 2017

(65) Prior Publication Data

US 2019/0140072 A1    May 9, 2019

(51) Int. Cl.
| | | |
|---|---|---|
| H01L 29/08 | (2006.01) | |
| H01L 29/66 | (2006.01) | |
| H01L 29/732 | (2006.01) | |
| H01L 29/737 | (2006.01) | |

(52) U.S. Cl.
CPC .... H01L 29/0821 (2013.01); H01L 29/66242 (2013.01); H01L 29/732 (2013.01); H01L 29/7371 (2013.01)

(58) Field of Classification Search
CPC .................. H01L 29/73–7378; H01L 29/0821
See application file for complete search history.

(56) References Cited

U.S. PATENT DOCUMENTS 5,367,184 A * 11/1994 Chantre ............ H01L 29/66242
                                                          257/192
9,608,096 B1 * 3/2017 Camillo-Castillo ........................
                                                     H01L 29/732

2006/0040456 A1 * 2/2006 Bock ................... H01L 29/0649
                                                         438/334
2013/0270649 A1   10/2013 Chantre et al.
2014/0167116 A1    6/2014 Chevalier et al.
2017/0236923 A1    8/2017 Chevalier

OTHER PUBLICATIONS

Galy, et al: "Challenges & Solutions for High Volume Production in SiGe BICMOS & CMOS Technologies for High-Frequency and Optical Communications," 2015 IEEE Compound Semiconductor Integrated Circuit Symposium (4 pages).
Schroter, et al: "SiGe HBT Technology: Future Trends and TCAD-Based Roadmap," Proceedings of the IEEE, vol. 105 Issue: 6, 2017, pp. 1068-1086.

* cited by examiner

*Primary Examiner* — Laura M Menz
*Assistant Examiner* — Candice Chan
(74) *Attorney, Agent, or Firm* — Crowe & Dunlevy

(57) ABSTRACT

A bipolar transistor is supported by a single-crystal silicon substrate including a collector connection region. A first epitaxial region forms a collector region doped with a first conductivity type on the collector connection region. The collector region includes a counter-doped region of a second conductivity type. A second epitaxial region forms a base region of a second conductivity type on the first epitaxial region. Deposited semiconductor material forms an emitter region of the first conductivity type on the second epitaxial region. The collector region, base region and emitter region are located within an opening formed in a stack of insulating layers that includes a sacrificial layer. The sacrificial layer is selectively removed to expose a side wall of the base region. Epitaxial growth from the exposed sidewall forms a base contact region.

23 Claims, 10 Drawing Sheets

HETEROJUNCTION BIPOLAR TRANSISTOR WITH COUNTER-DOPED COLLECTOR REGION AND INCREASE COLLECTOR DEPENDENT BREAKDOWN VOLTAGE

TECHNICAL FIELD

The present disclosure relates to a heterojunction bipolar transistor and to a method of manufacturing a heterojunction bipolar transistor.

BACKGROUND

For high-frequency applications, bipolar transistors, and in particular heterojunction bipolar transistors (HBT), are currently used. It is known to tune a bipolar transistor for operation with a desired voltage/frequency characteristic. For example, the bipolar transistor may be of a high speed (HS) type that is tuned for best operation to handle high frequency signals. Alternatively, the bipolar transistor may be of a medium voltage (MV) type that is tuned for best operation over a voltage range of, for example, 2V to 3V. Lastly, the bipolar transistor may be of a high voltage (HV) type that is tuned for best operation over a voltage range of, for example, 3V to 8V. Typically, the emitter and base modules are the same across the variety of tuned bipolar transistors. The tuning of the bipolar transistor for a desired application is typically accomplished by modifying the collector module of the transistor.

FIG. 1 is a cross sectional view illustrating an example of a conventional bipolar transistor. At the top surface of a substrate 10, an active area is delimited by isolating structures 12 referred to in the art as deep trench isolation (DTI). A heavily-doped region 14 of a first conductivity type (for example, N type) forming the collector of the bipolar transistor extends in depth in the active area of the substrate 10 delimited by the trenches 12. There is a less heavily-doped layer 16, also of the first conductivity type, at the substrate surface over the region 14. The layer 16 may comprise a layer that is epitaxially grown from the substrate 10. Further isolating structures 18, referred to in the art as shallow trench isolation (STI), delimit the less heavily-doped layer 16 and have a depth which is deeper than a depth of the heavily-doped region 14. Regions 20 for accessing the heavily-doped region 14 of the collector (known in the art as a collector sinker) pass through isolating structures 18. In practice, the regions 20 may comprise a heavily-doped first conductivity type region of the substrate 10.

At the top surface of the substrate 10, a stack is formed comprising an insulating layer 22, for example, an oxide, and a heavily-doped polysilicon layer 24 of a second conductivity type (for example, P type). The stack of layers 22 and 24 extends over the less heavily-doped layer 16 and at least partially over the STI structures 18 on either side of the less heavily-doped layer 16. The layer 16 may be selectively doped, forming a selectively implanted collector (SIC) region 17, with first conductivity type dopant using an implantation through an opening formed in the insulating layer 22. The portion of the layer 22 removed for the making the opening over the less heavily-doped layer 16 is replaced with a stack 25 doped with the second conductivity type comprising a silicon-germanium layer (perhaps including carbon SiGe:C) and a silicon layer. Stack 25 forms the base of the bipolar transistor. The stack 25 may be epitaxially grown from an underside of layer 24 and from the top side of layer 16. An opening is also provided in layer 24, opposite to region 16 and on a smaller surface area than the opening in layer 22. Within the opening defined in layer 24, as well as at the top surface of layer 25, a heavily-doped region 26 of the first conductivity type forming the emitter region of the bipolar transistor is provided. Region 26 is separated from layer 24 by spacers 28 made of insulating material.

An emitter (E) contact 29 is provided on heavily-doped region 26 via a silicide layer 30. A base (B) contact 32 is provided on layer 24 via a silicide layer 34. A collector (C) contact 36 is provided on regions 20 via a silicide layer 38.

The structure of the collector module formed by layer 14, layer 16, and SIC region 17 controls tuning of the bipolar transistor operation to have a desired voltage/frequency characteristic. For example, a bipolar transistor of a high speed (HS) type is controlled by the presence of the selectively implanted collector (SIC) region 17, and the use of a thin collector epitaxy for the layer 16. A bipolar transistor of a medium voltage (MV) type is controlled by omitting the SIC region 17. A bipolar transistor of a high voltage (HV) type is controlled by omitting the SIC region 17 and adjusting some other implantations.

It is recognized by those skilled in the art that there is an advantage to providing a bipolar transistor which exhibits a greater transit frequency. One known way to drive increased transit frequency is to increase the collector doping level. However, tight control must be exercised over the base/collector doping profile in order to minimize the impact of collector doping on the base-collector capacitance. One means for achieving this objective is to replace the N type SIC region 17 in layer 16 in instead use an N type in-situ doped collector layer for layer 16. This in-situ doped collector layer, however, would be present in all bipolar transistors fabricated on the same substrate, and such a structure would accordingly preclude the fabrication of MV and HV type transistors. At this step no masking for epitaxy is possible, this later is applied to all silicon opened region. The dopants level needed to obtain a HS transistor cannot be modified over the wafer. So, no different level of dopants needed to have HS/MV/HV transistors can be simultaneously performed.

Those skilled in the art further recognize that the collector dependent breakdown voltages (BV), such as in the common base configuration ($BV_{CBO}$) or common emitter configuration ($BV_{CEO}$), are limited by the collector doping. For example, in the HS type transistor the breakdown voltages are limited by the doping level of the SIC implant, and in the MV type transistor the breakdown voltages are limited by upward diffusion from the buried layer 14 into the layer 16.

There is a need in the art for a bipolar transistor structure and a method for making such a bipolar transistor structure that supports increased collector dependent breakdown voltages for the MV type and HV type of transistors while supporting the fabrication of HS, MV and HV transistors.

SUMMARY

In an embodiment, a bipolar transistor comprises: a single-crystal semiconductor substrate including a collector connection region doped with a first conductivity type; a first insulating layer over the single-crystal semiconductor substrate; a silicon layer over the first insulating layer; an opening extending through the silicon layer and the first insulating layer; a semiconductor collector region doped with the first conductivity type within the opening and resting on the single-crystal semiconductor substrate; a counter-doped region located within the semiconductor collector region and doped with a second conductivity type; a semiconductor base region doped with the second conductivity type on top of the semiconductor collector region; and a semiconductor emitter region doped with the first conductivity type on top of the semiconductor base region.

In an embodiment, a method of manufacturing a bipolar transistor in a structure including a single-crystal silicon substrate including a collector connection region doped with a first conductivity type is presented. The method comprises the steps of: a) coating the substrate in succession with a first insulating layer and a silicon layer; b) etching an opening through the silicon layer and the first insulating layer to expose a top surface of the substrate; c) in the opening, forming by selective epitaxy from the top surface of the substrate a collector region made of semiconductor material doped with the first conductivity type; d) forming a counter-doped region located within the semiconductor collector region and doped with a second conductivity type; e) forming by selective epitaxy from a top surface of the collector region a base region made of semiconductor material doped with the second conductivity type; and f) forming by deposition on a top surface of the base region an emitter region made of semiconductor material doped with the first conductivity type.

In an embodiment, an integrated circuit comprises: a single-crystal semiconductor substrate including a first collector connection region doped with a first conductivity type and a second collector connection region doped with the first conductivity type; a first insulating layer over the single-crystal semiconductor substrate; a silicon layer over the first insulating layer; a first opening extending through the silicon layer and the first insulating layer; and a second opening extending through the silicon layer and the first insulating layer. A first bipolar transistor comprises: a first semiconductor collector region doped with the first conductivity type within the first opening and resting on the single-crystal semiconductor substrate; a counter-doped region located within the first semiconductor collector region and doped with a second conductivity type; a first semiconductor base region doped with the second conductivity type on top of the first semiconductor collector region; and a first semiconductor emitter region doped with the first conductivity type on top of the first semiconductor base region. A second bipolar transistor comprises: a second semiconductor collector region doped with the first conductivity type within the second opening and resting on the single-crystal semiconductor substrate; a second semiconductor base region doped with the second conductivity type on top of the second semiconductor collector region; and a second semiconductor emitter region doped with the first conductivity type on top of the second semiconductor base region.

In an embodiment, an integrated circuit comprises: a single-crystal semiconductor substrate including a first collector connection region doped with a first conductivity type and a second collector connection region doped with the first conductivity type; a first insulating layer over the single-crystal semiconductor substrate; a silicon layer over the first insulating layer; a first opening extending through the silicon layer and the first insulating layer; and a second opening extending through the silicon layer and the first insulating layer. A first bipolar transistor comprises: a first semiconductor collector region doped with the first conductivity type within the first opening and resting on the single-crystal semiconductor substrate; a first counter-doped region located within the first semiconductor collector region and doped with a second conductivity type; a first semiconductor base region doped with the second conductivity type on top of the first semiconductor collector region; and a first semiconductor emitter region doped with the first conductivity type on top of the first semiconductor base region. A second bipolar transistor comprises: a second semiconductor collector region doped with the first conductivity type within the second opening and resting on the single-crystal semiconductor substrate; a second counter-doped region located within the second semiconductor collector region and doped with a second conductivity type; a second semiconductor base region doped with the second conductivity type on top of the second semiconductor collector region; and a second semiconductor emitter region doped with the first conductivity type on top of the second semiconductor base region.

BRIEF DESCRIPTION OF THE DRAWINGS

The foregoing and other features and advantages will be discussed in detail in the following non-limiting description of specific embodiments in connection with.

DETAILED DESCRIPTION

Figure 1:
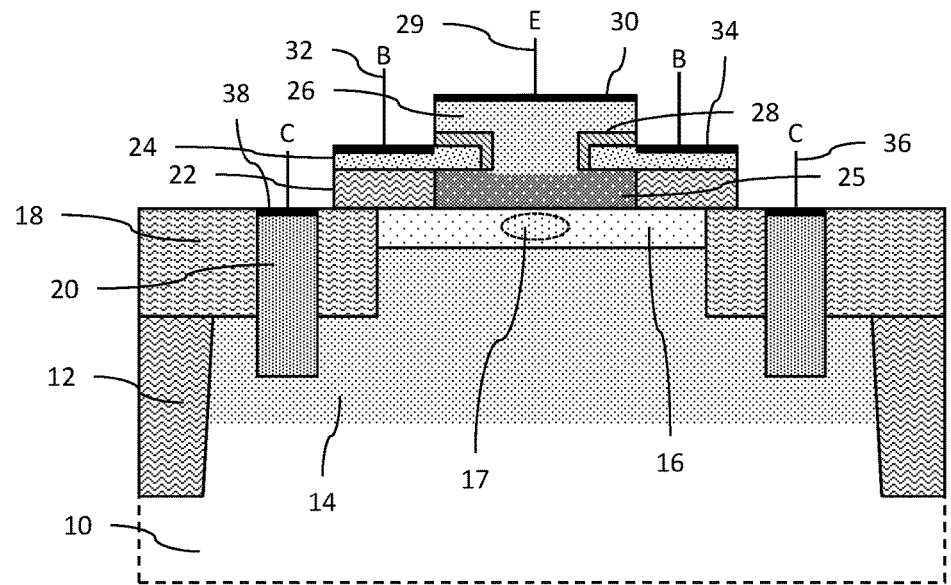
FIG. 1 is a cross sectional view of a conventional bipolar transistor.

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

Figure 2:
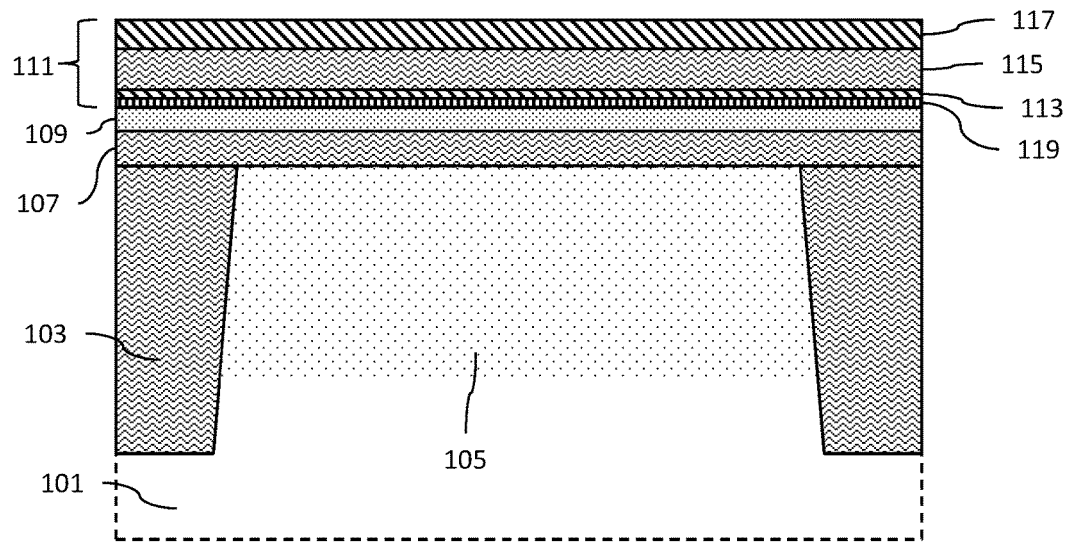
FIGS. 2-16 are cross sectional views that illustrate steps of an embodiment of a method for manufacturing a heterojunction bipolar transistor.

In FIG. 2, a structure comprises a single-crystal silicon substrate 101 including insulating structures 103, for example, of the deep trench isolation (DTI) type, are provided to delimit a location where a heterojunction bipolar transistor is desired to be formed. At the location of the transistor, substrate 101 comprises a heavily-doped region 105 of a first conductivity type, for example, type N. The region 105 is flush with the upper (top) surface of substrate 101 and forms a collector connection region for the heterojunction bipolar transistor.

The upper surface of substrate 101 is coated with an insulating layer 107 (that is made of silicon dioxide, for example) that is coated with a semiconductor material (for example, silicon) layer 109. Layer 109 may be a polysilicon layer deposited on insulating layer 107. Layer 109 may also be a single-crystal silicon layer. As an example, the layer 109 may correspond to the silicon layer of a structure of SOI (Semiconductor On Insulator) type. Layer 109 may have a doping of a second conductivity type, for example, type P.

The deep trench isolation insulating structures 103 may be formed before the deposition of each of the layers forming the stack of layers 111, particularly in the case where silicon layer 109 is the silicon layer of an SOI-type structure.

A stack of layers 111 rests on layer 109. The stack 111 comprises a first insulating layer 119 that is coated with a second insulating layer 113 that is coated with a third insulating layer 115 that is coated with a fourth insulating layer 117. The material of layers 115 and 119 and the material of layers 113 and 117 are selected to be selectively etchable over each other. In an embodiment, the layers 113 and 117 are made of silicon nitride and the layers 115 and 119 are made of silicon oxide.

Figure 3:
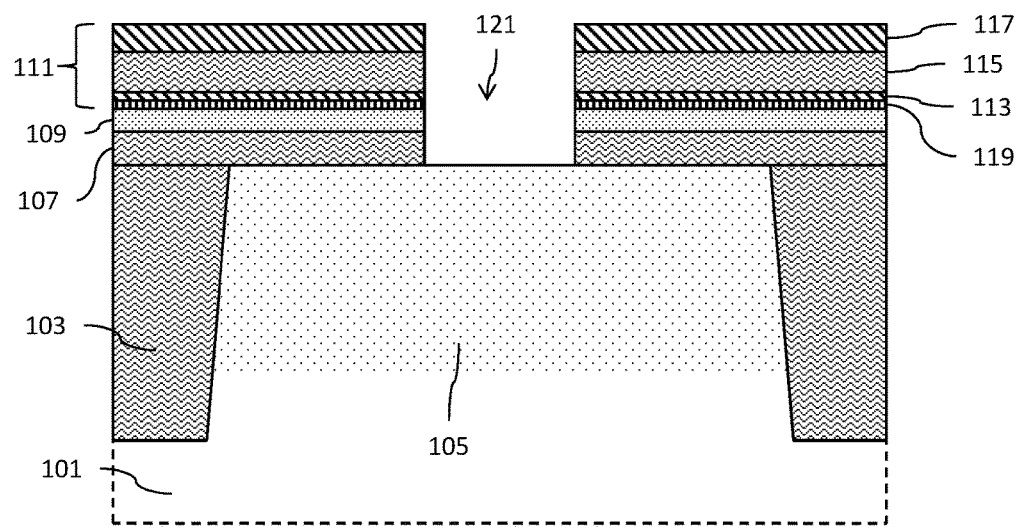

FIG. 3 shows the structure after the etching of an opening 121 that crosses completely through the stack 111, the silicon layer 109, and the insulating layer 107 all the way to reach the collector connection region 105 at the top surface of the substrate 101. The etch process used may, for example, comprise major anisotropic and minor isotropic etch steps.

Figure 4:
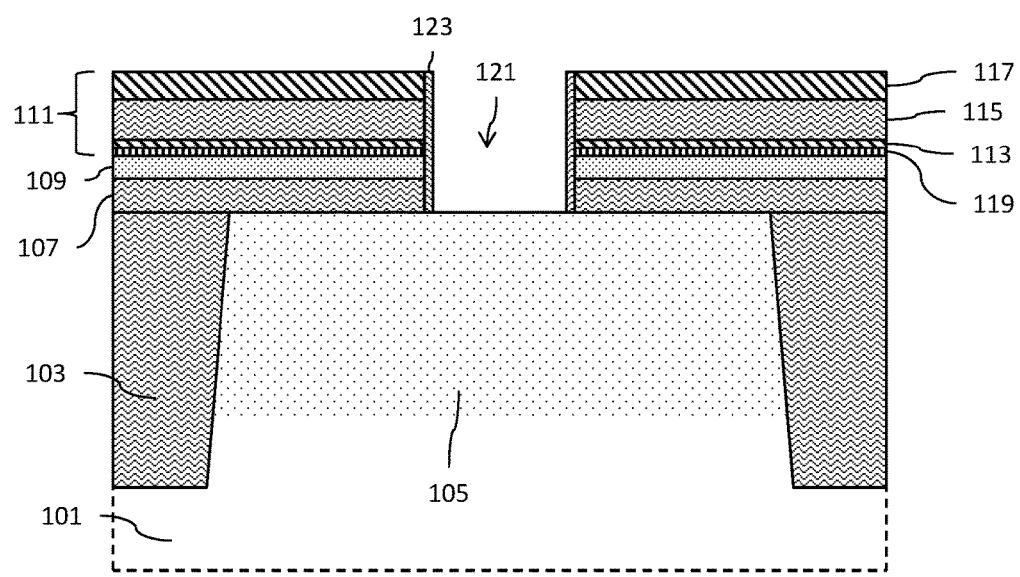

FIG. 4 shows the structure after lining side walls of the opening 121 with an insulating layer 123. The layer 123 may, for example, be made of silicon oxide material. The bottom of opening 121 at the top surface of the substrate 101 is not covered by the layer 123.

Figure 5:
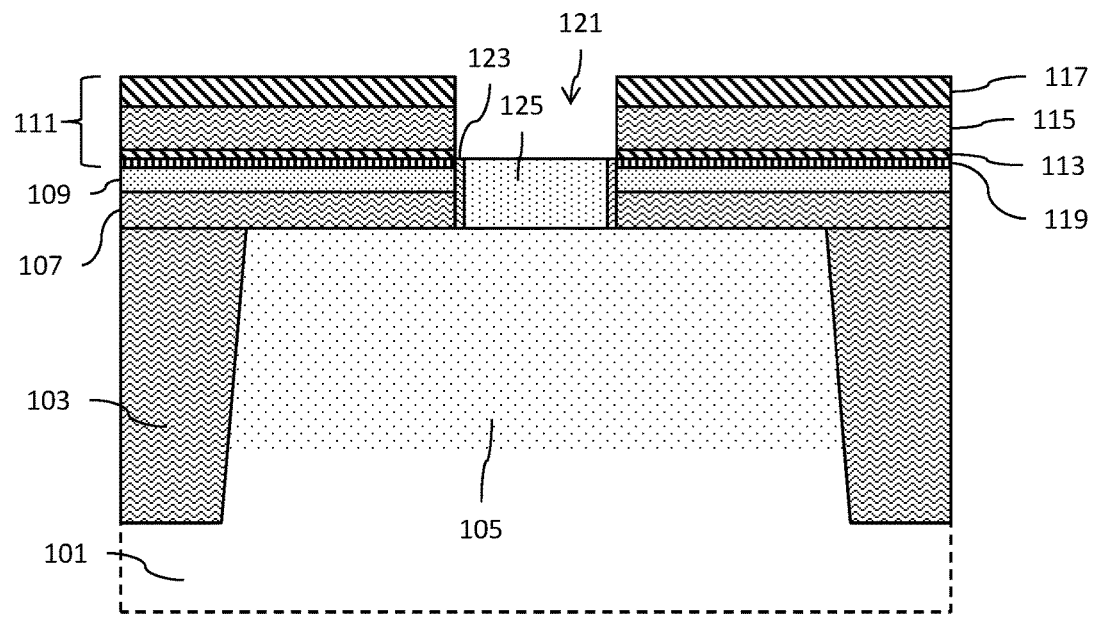

FIG. 5 shows the structure after forming, in opening 121, a transistor collector region 125 of the heterojunction bipolar transistor. The collector region 125 is made of a region of single-crystal silicon formed by selective epitaxy from the top surface of substrate 101. The collector region 125 has a thickness such that a top surface of the collector region 125 is at least as high as a top surface of the layer 109 and lower than or equal to a bottom surface of layer 115. Preferably, the level of the top surface of collector region 125 is slightly lower, for example, by from 1 to 3 nm, than the lower surface of layer 115. The collector region 125 is doped during the epitaxy or (less probably) by implantation after the epitaxy with the first conductivity type. As an example, the collector region 125 is doped with phosphorus atoms, possibly associated with carbon atoms to limit the exodiffusion of phosphorus atoms, and/or with arsenic atoms. An exposed portion of the layer 123 after formation of the collector region 125 is removed.

Figure 6:
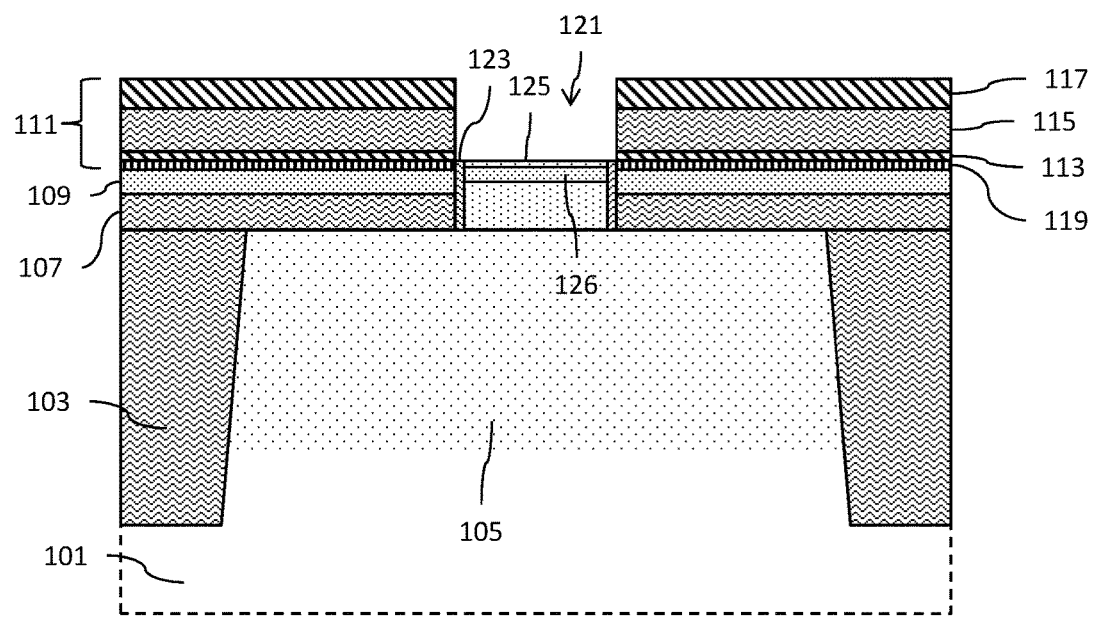

If the bipolar transistor is to be of the MV type or HV type, a counter doping of the collector region 125 is performed by implanting dopant of the second conductivity type, for example, type P. This forms a counter-doped region 126 at or near the top surface of the collector region 125. Thus, both N type and P type dopants are present in the region 126 of the collector region 125 at a location which is adjacent to the not-yet-formed base region of the transistor. The structure is shown in FIG. 6.

Figure 17A:
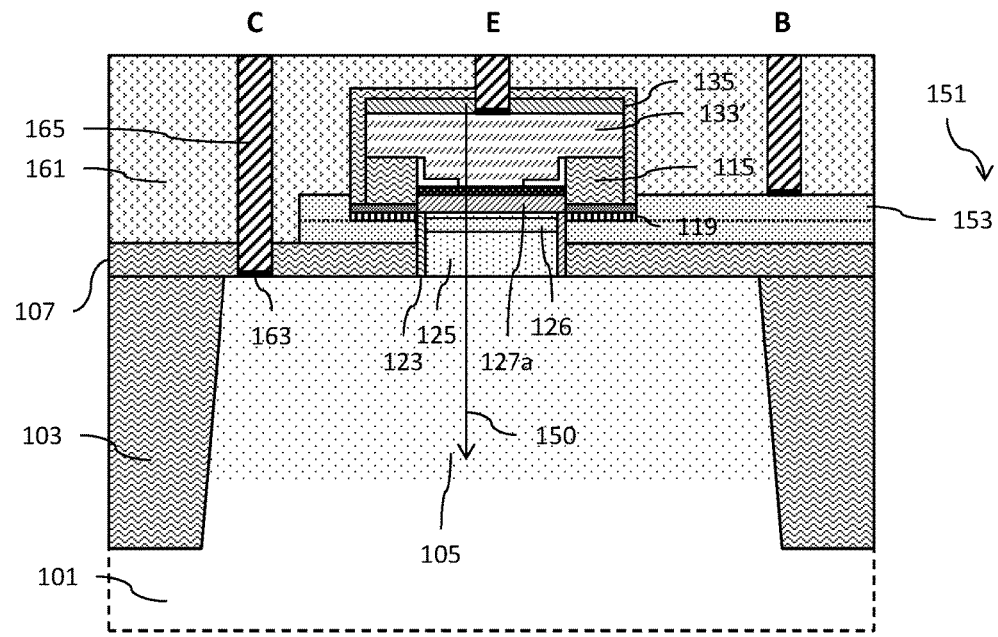
FIG. 17A is a cross sectional view of the completed bipolar transistor with contacts and a collector region having a counter-doped region of opposite conductivity type.
Figure 18A:
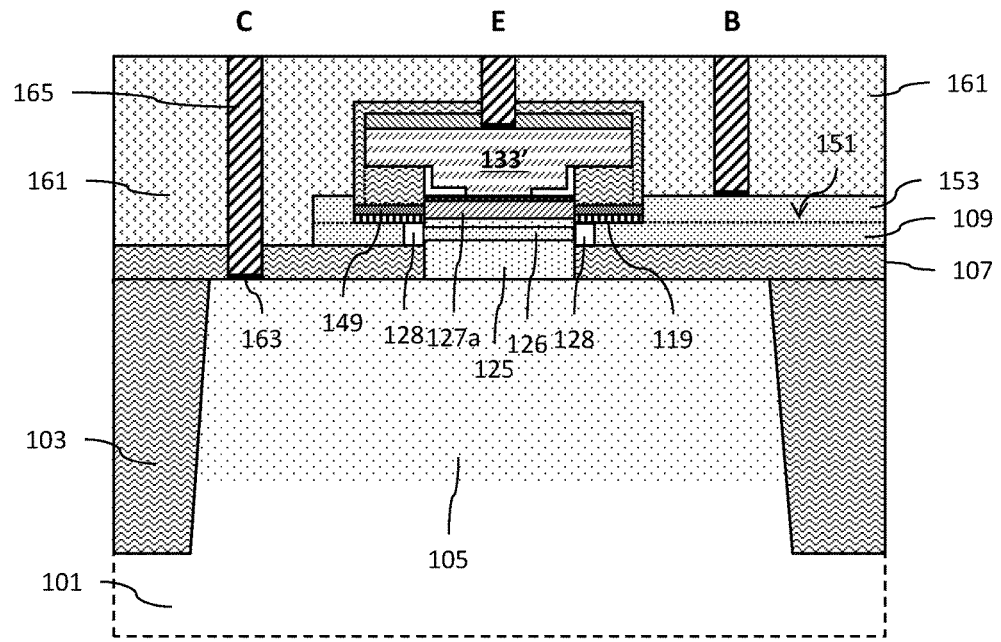
FIG. 18A is a cross sectional view of the completed bipolar transistor with contacts, an air spacer and a collector region having a counter-doped region of opposite conductivity type.
Figure 18B:
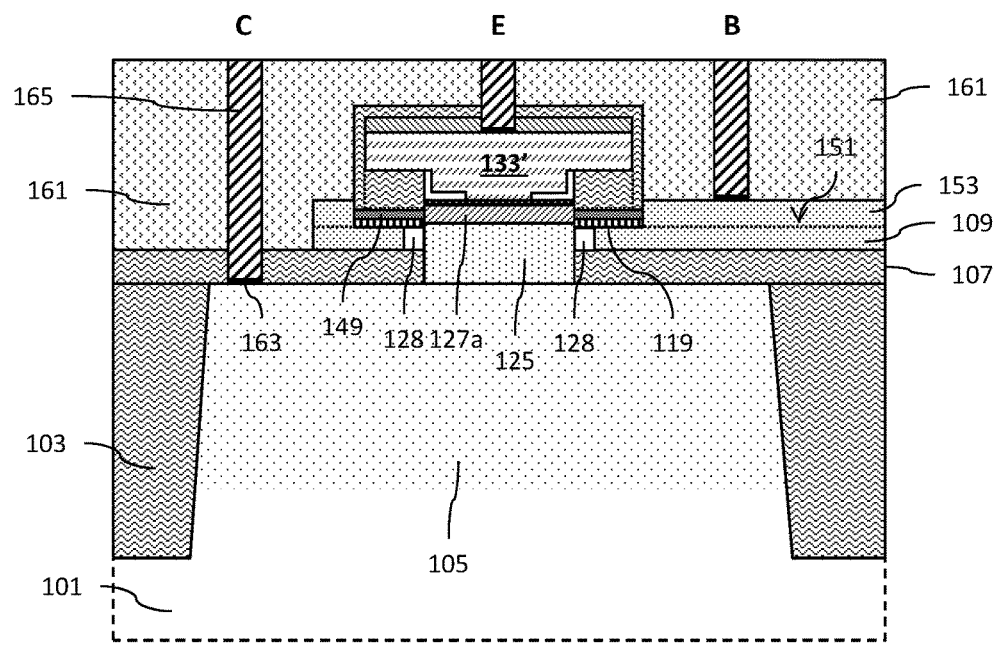
FIG. 18B is a cross sectional view of the completed bipolar transistor with contacts, an air spacer and a collector region that does not have a counter-doped region of opposite conductivity type.

If the bipolar transistor is instead to be of the HS type, the structure is masked so that counter doping implant does not affect the collector region 125. In this way, it will be understood that the process disclosed herein for fabricating bipolar transistors is identical for MV, HV and HS type bipolar transistors with the exception of the masking and counter doping implant in the collector region 125 that is provided solely for MV and HV type transistors. Concurrent fabrication of MV, HV and HS type bipolar transistors on a common substrate is thus possible. In the remaining FIGS. 7-16 illustrating the fabrication process, the counter-doped region 126 is present, but it will be understood that this counter-doped region 126 relates only to those bipolar transistors that are of the MV and HV type (with a final structure as shown in FIG. 17A). With respect to bipolar transistors of the HS type (with a final structure as shown in FIG. 18B) the reader should understand that the counter-doped region 126 would not be present.

Figure 7:
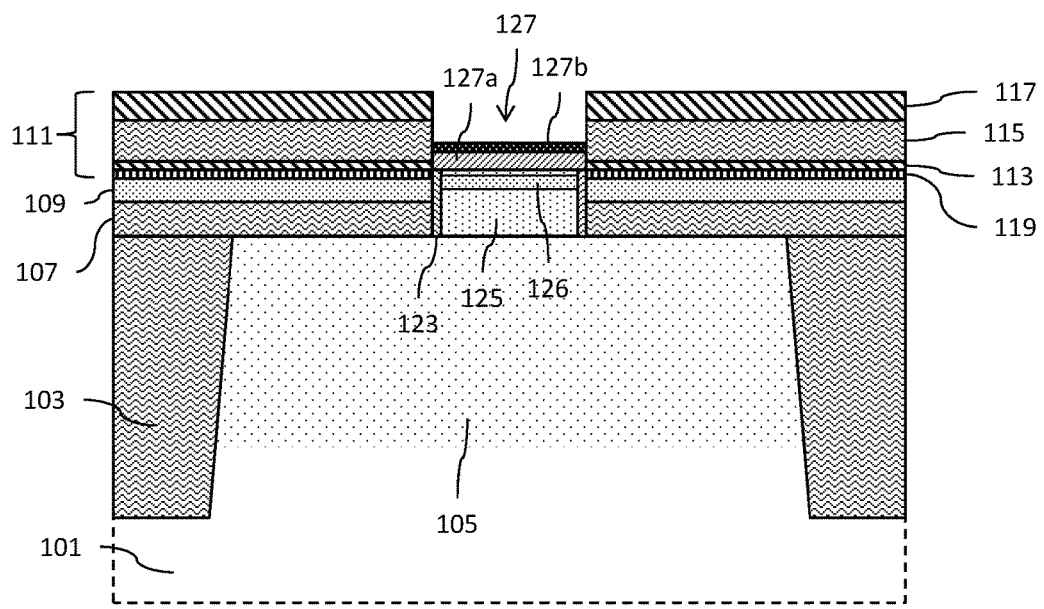

FIG. 7 shows the structure after the forming, in opening 121, a transistor base region 127 comprising a stack of a doped region 127a and a silicon capping region 127b. The doped region 127a of the transistor base region 127 is made of a single-crystal semiconductor material such as silicon or, preferably, silicon-germanium as in the present embodiment. Doped region 127a is formed by selective epitaxy from collector region 125. The doped region 127a has a thickness such that a top surface of the doped region 127a is higher than a top surface of the insulating layer 113 but below the top surface of the layer 115. The doped region 127a is doped with the second conductivity type, preferably during the epitaxy. As an example, doped region 127a is doped with boron atoms, possibly associated with carbon atoms to avoid the exodiffusion of the boron atoms. The silicon capping region 127b is made of undoped single crystal semiconductor material and is formed by selective epitaxy from the top surface of the doped region 127a. The silicon capping region 127b has a thickness such that a top surface of the silicon capping region 127b is below the top surface of the layer 115.

Figure 8:
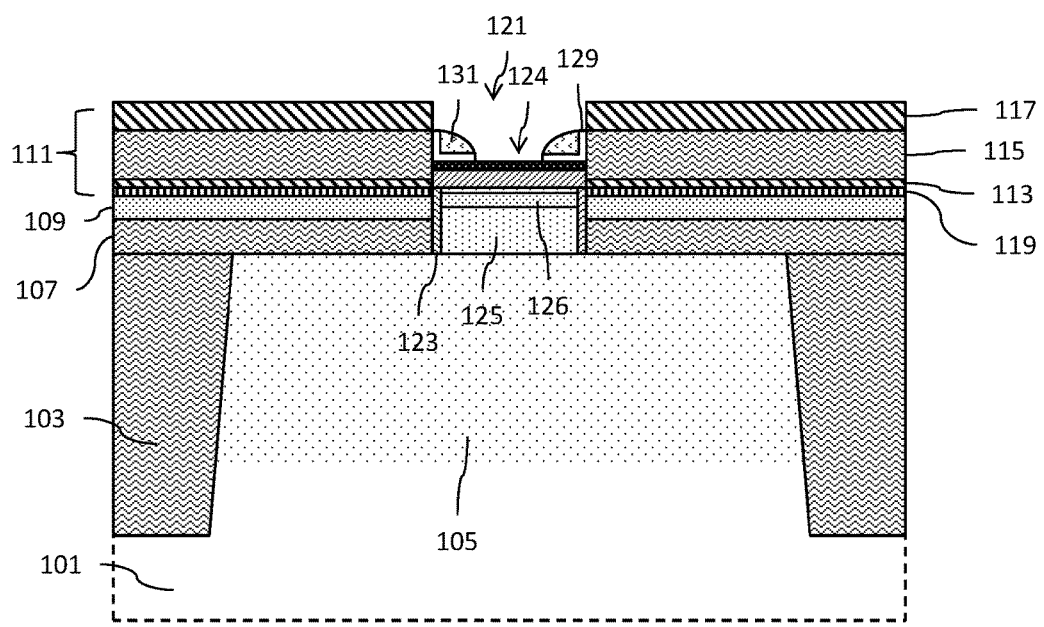

In FIG. 8, spacers 129 have been formed in the opening 121. The spacers 129 rest on the top surface of silicon capping region 127b and border the sidewall surfaces of at least the layer 115. An opening 124 is provided between the spacers 129 to expose a top surface of the silicon capping region 127b. The spacers 129 have, for example, in cross-sectional view, an L shape. As an example, the spacers 129 are made of silicon oxide. The spacers are formed by forming a silicon oxide layer on the sidewalls of the layer 115 and top surface of the silicon capping region 127b in the opening 121. A nitride deposit is then made on the silicon oxide layer followed by an etch which preferentially removes nitride material from horizontal surfaces. The nitride material remaining after the etch forms a "D" shape spacer 131 which functions as a mask. This mask is used for performing a further etch to remove a portion of the silicon oxide layer to make the opening 124.

Figure 9:
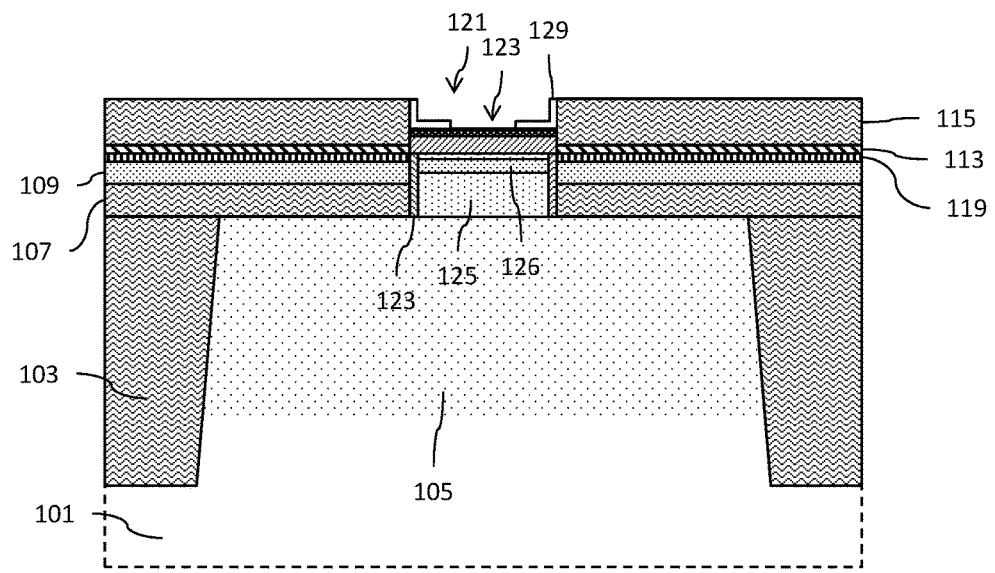

The remaining nitride material of the spacer 131 for the etch mask as well as the silicon nitride layer 117 are then removed by using an isotropic etching process. The result is shown in FIG. 9.

Figure 10:
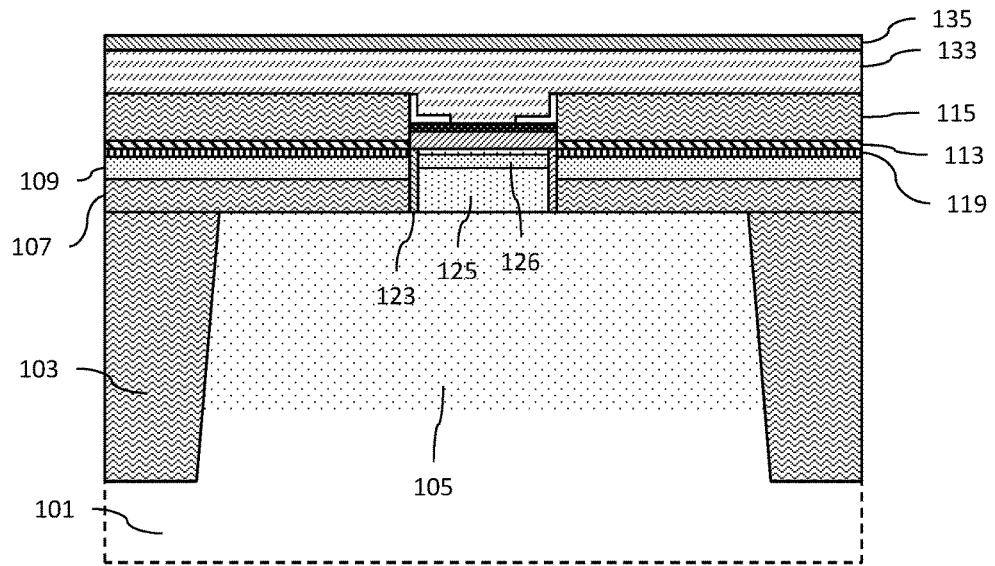

A silicon layer 133 doped with the first conductivity type is deposited all over the structure and fills openings 121 and 124. As an example, the silicon layer is deposited by RTCVD ("Reduced Temperature Chemical Vapor Deposition"), which enables the deposited silicon to be monocrystalline at the interface with the silicon capping region 127b of the transistor base region 127. A chemical mechanical polish may then be performed to planarize the top surface of the layer 133. An etch mask formed by a layer 135 (made of silicon oxide, for example) is then formed on the planar top surface of layer 133. The result is shown in FIG. 10.

Figure 11:
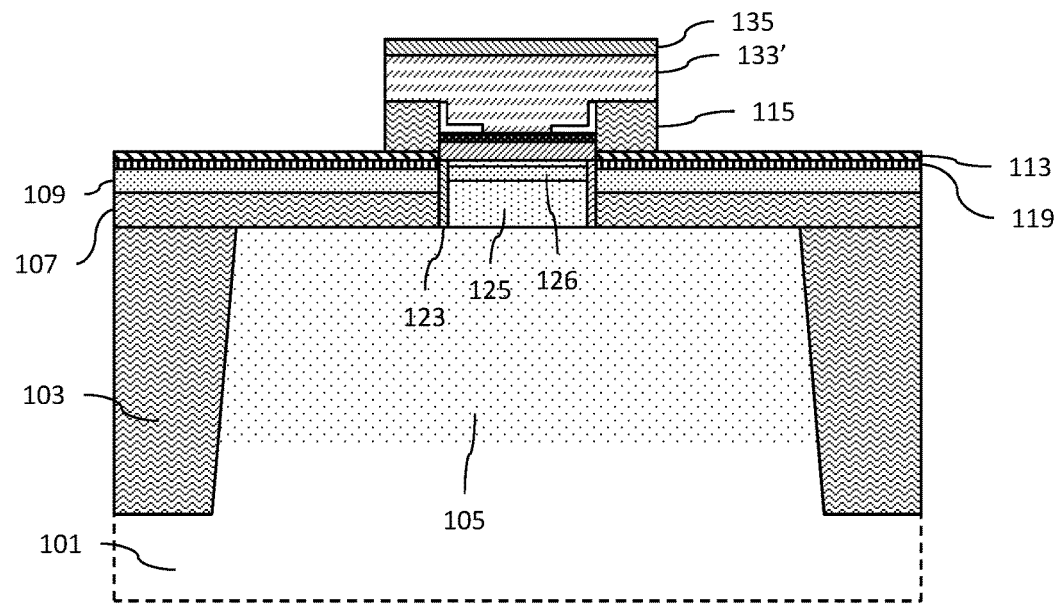

Convention lithographic processing is then performed to pattern the etch mask layer 135. An anisotropic etch is then performed to remove the unmasked portion of the doped silicon layer 133 and the unmasked portion of the oxide layer 115 all the way to nitride layer 113. The result is shown in FIG. 11. Thus, a portion 133' of the silicon layer 133 is left in place and forms the emitter region of the heterojunction bipolar transistor. The emitter region 133' comprises a central portion resting on the transistor base region 127 at silicon capping region 127b (extending through the opening 124) and a peripheral portion that laterally extends beyond the base region 127 and rests on a remaining portion of the layer 115.

Figure 12:
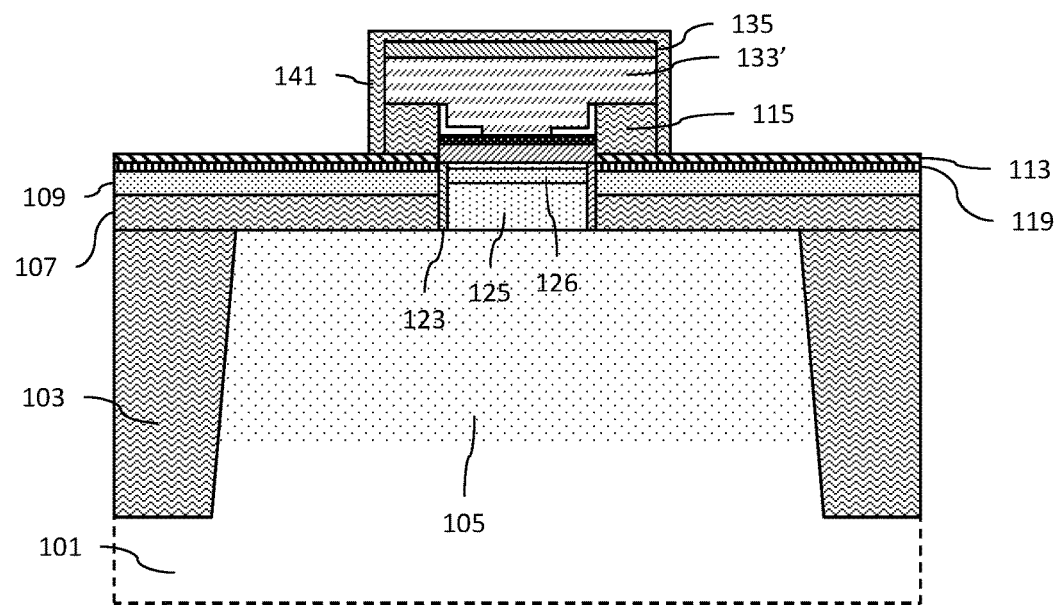

A deposition of a silicon oxide layer 141 is made to cover the top of layer 135 and the side walls of the emitter region 133' and the side walls of the remaining portion of the oxide layer 115. Then, an anisotropic etch is performed to remove the silicon oxide from the top surface of the layer 113. The result is shown in FIG. 12. In an embodiment, the layer 135 may be removed prior to the deposition of layer 141.

Figure 13:
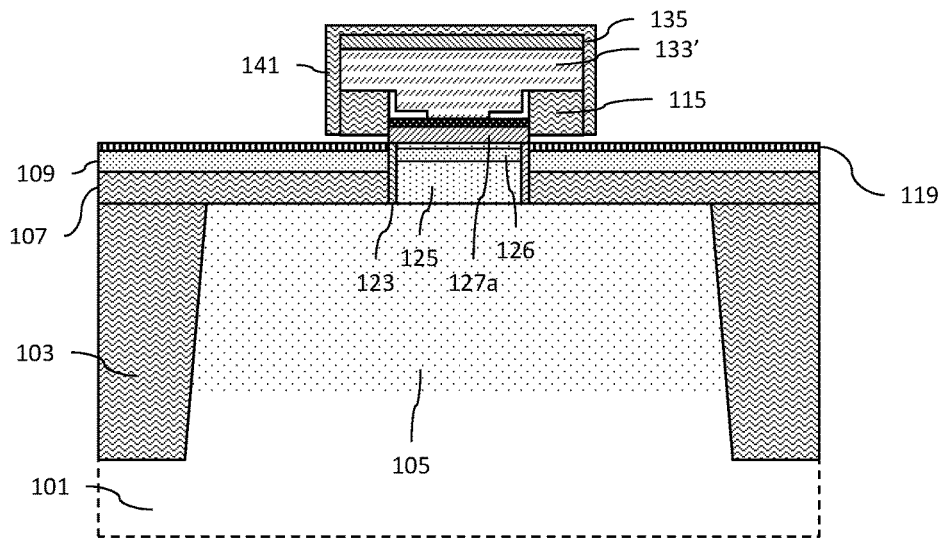

In the step illustrated by FIG. 13, the nitride layer 113 has been removed by isotropic etching selective over the material of layers 115, 119 and 141. This exposes the lateral side wall of the base region 127 (more specifically, a lateral side wall of the doped region 127a).

Figure 14:
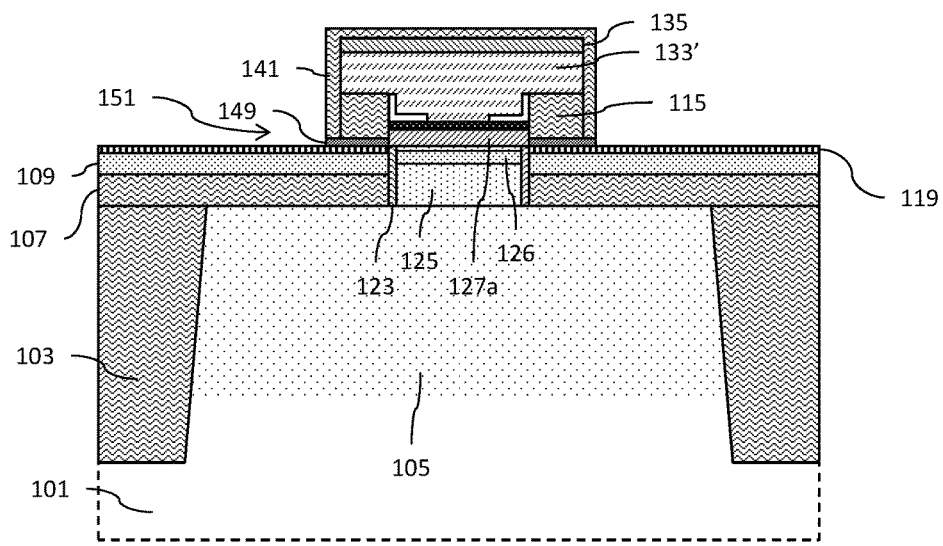

FIG. 14 shows the structure after formation of a first portion 149 of a base contact region 151. The first portion 149 is made of single-crystal silicon formed by selective epitaxy from the lateral side wall of the base region 127. Thus, the portion 149 of the base contact region 151 is monocrystalline, which advantageously enables to decrease the resistance at the interface between base contact region 151 and base region 127 with respect to the case of a transistor which would have its base contact region made of polysilicon. In this example, the first portion 149 of base contact region 151 extends laterally all the way at least to the peripheral edge of the remaining portion of layer 141.

Figure 15:
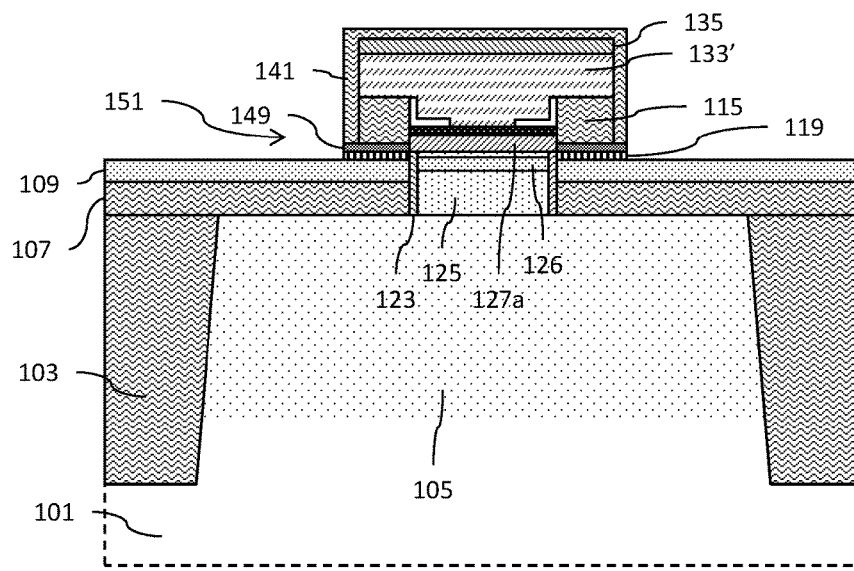

Conventional isotropic etching techniques are then used to selectively remove a portion of insulating layer 119 and expose a top surface of the semiconductor layer 109. The result is shown in FIG. 15.

Figure 16:
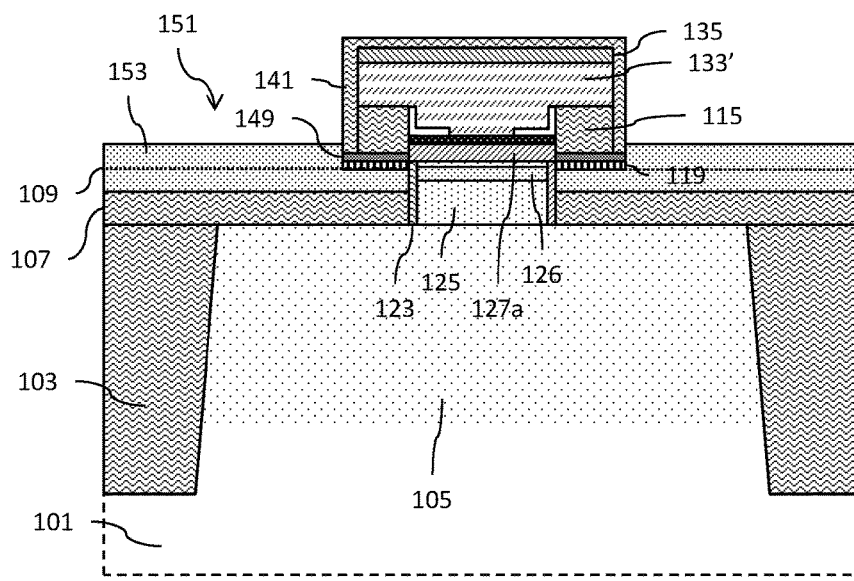

FIG. 16 shows the structure after formation of a second portion 153 of the base contact region 151. The second portion 153 is made of polycrystalline silicon formed by selective epitaxy of doped silicon of the second conductivity type from the top surface of the polysilicon semiconductor layer 109 and the lateral side wall of the first portion 149. In the case where silicon layer 109 was not doped at the step of FIG. 1, it may be doped by diffusion of dopant atoms from the base contact region 151, and in particular from the first portion 149.

Advantageously, if the starting point for the substrate is a SOI-type structure, then the semiconductor layer 109 is made of single-crystal silicon and the second portion 153 of base contact region 151 will also be made of single-crystal silicon grown by selective epitaxy. Advantageously, the entire base contact region 151 in such an implementation will be made of single-crystal silicon which enables to decrease the resistance of base contact region 151, and thus decrease the resistance of access to the base region 127 with respect to the case of a transistor where all or part of the base contact region is made of polysilicon.

In an alternative implementation, the first and second portions 149 and 153 of the base contact region 151 may be formed simultaneously. To achieve this, the nitride layer 113 is removed to expose the lateral side wall of the base region 127 and the portion of insulating layer 119 is removed to expose the top surface of the semiconductor layer 109. These removal steps are performed prior to performing any epitaxial growth. Then, the first and second portions 149 and 153 are simultaneously formed by epitaxy from the side wall of base region 127 and the top surface of silicon layer 109. A structure similar to that shown in FIG. 16 is then obtained.

Figure 17B:
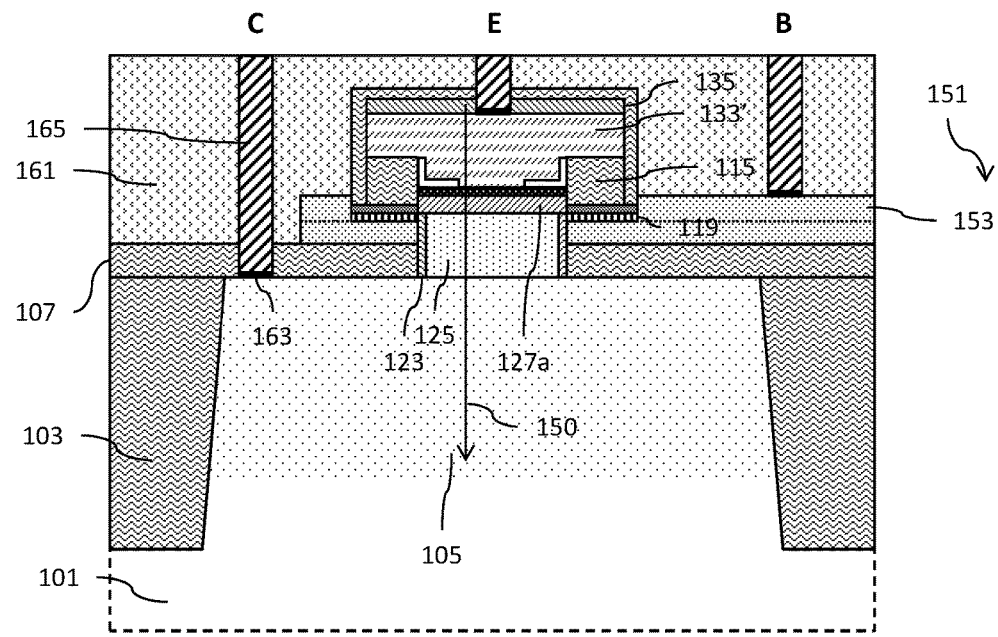
FIG. 17B is a cross sectional view of the completed bipolar transistor with contacts and a collector region that does not have a counter-doped region of opposite conductivity type.

The bipolar transistor further includes structure for making electrical contact to the emitter (E), base (B) and collector (C) terminals of the heterojunction bipolar transistor. A premetallization dielectric layer 161 covers the structure. A layer of silicide 163 is provided at each contact location with the collector connection region 105, the emitter region 133' and the base contact region 151. A metal contact plug 165 extends through the premetallization dielectric layer 161 to make contact with the silicide 163. FIG. 17A shows the bipolar transistor in the configuration (supporting MV type and HV type devices) which includes the counter-doped region 126 within the collector region 125. FIG. 17B shows the bipolar transistor in the configuration (supporting an HS type device) that does not include the counter-doped region 126 within the collector region 125.

Access to the collector connection region 105 for the purpose of exposing the top surface of the substrate 101 can be achieved by forming a mask over the emitter region 133' and on portions of the base contact region 151 that laterally extend adjacent to the emitter region 133'. An etch may then be performed through the mask. The premetallization dielectric layer 161 may then be deposited over the structures.

The silicide process to form silicide layers 163 may be performed using well known techniques at any suitable point in the fabrication process. The silicide layers 163 are formed at the upper surface of the emitter region 133', on the upper surface of collector connection region 105, and on the upper surface of the base contact region 151.

Each step of the previously-described method is a step currently used in standard CMOS methods, whereby this method is compatible with standard CMOS methods. Thus, the bipolar transistors as shown herein may be fabricated on a common substrate with CMOS devices to support BiCMOS circuit implementations.

As an example, the various previously-described layers, regions, portions may have the following dimensions:
  a thickness in the range from 10 to 75 nm, for example, 25 nm, for insulating layer 107;
  a thickness in the range from 3 to 20 nm, for example, 7 nm, for silicon layer 109;
  a thickness in the range from 10 to 40 nm, for example, 20 nm, for insulating layer 113;
  a thickness in the range from 5 to 20 nm, for example, 10 nm, for insulating layer 119;
  a thickness in the range from 10 to 50 nm, for example, 25 nm, for layers 115 and 117;
  a width from 0.1 to 0.3 µm, for example, 0.2 µm, for opening 121; and
  a thickness in the range from 50 to 200 nm, for example, 75 nm, for the silicon layer 133.

The doping levels of the various previously-described layers, regions, portions will be selected conventionally.

In the context of FIG. 17A, an MV type device is distinguishable from an HV type device by the dose and/or energy of the counter-doping implantation. Conventional lithographic processes can be used to differentiate between the MV type devices and the HV type devices during fabrication.

The bipolar transistors of FIGS. 17A and 17B illustrate the use of the insulating layer 123 to insulate the collector region 125 from the layer 109 (which is used for making contact to the base region). It will be understood that other insulating structures may instead be used. For example, FIGS. 18A and 18B illustrate the use of an air spacer 128 positioned between the collector region 125 and the layer 109. The process for forming a bipolar transistor with an air spacer 128 is taught by U.S. patent application Ser. No. 15/783,469 (the disclosure of which is incorporated by reference). FIG. 18A shows the bipolar transistor in the configuration (supporting MV type and HV type devices) which includes the counter-doped region 126 within the collector region 125. FIG. 18B shows the bipolar transistor in the configuration (supporting an HS type device) that does not include the counter-doped region 126 within the collector region 125.

With respect to line 150 of FIGS. 17A and 17B, an example dopant profile for the structure would include first conductivity type (for example, N) dopants in the regions 133' and 125 in a range of $1\times10^{19}$ to $1\times10^{20}$ at/cm$^3$ and second conductivity type (for example, P) dopants in the region 127a in a range of $1\times10^{19}$ to $5\times10^{19}$ at/cm$^3$ and in the region 126 in a range of $5\times10^{18}$ to $1\times10^{19}$ at/cm$^3$. More particularly, a maximum doping concentration of the first conductivity type dopant in region 125 will be greater than a maximum doping concentration of the second conductivity type dopant in region 126 (for example, to a degree on the order of about one order of magnitude; such as where region 125 has a maximum doping concentration of $1\times10^{20}$ at/cm$^3$ and region 126 has a maximum doping concentration of $1\times10^{19}$ at/cm$^3$).

With reference once again to FIG. 6 and the implantation of the counter dopant to form counter-doped region 126, and for a given energy level of the implantation, the dosage level of the second conductivity type dopant implantation has an effect on the common emitter configuration breakdown voltage ($BV_{CEO}$) in that the breakdown voltage increases with increase in dosage level. Furthermore, for a given energy level of the implantation, an increase in the dosage level of the second conductivity type dopant may cause a decrease in frequency of the transit frequency (fT) and the maximum frequency (fMAX).

The energy level used for the implant of the second conductivity type dopant also has an effect on the common emitter configuration breakdown voltage ($BV_{CEO}$). For example, an increase in energy level may result in a decrease in the breakdown voltage. The energy level used for the implant of the second conductivity type dopant may also affect the frequency of the transit frequency (fT). For example, an increase in energy level may result in an increase in transit frequency.

It will be understood that the bipolar transistors described herein and illustrated in the figures may be of either the NPN (first dopant conductivity type is N and second dopant conductivity type is P) or PNP type (first dopant conductivity type is P and second dopant conductivity type is N).

The transistor of FIG. 17A (or 18A) and the transistor of FIG. 17B (or 18B) may be provided and supported on a common substrate 101 in different regions of that substrate and used to form an integrated circuit which includes bipolar transistors of two or more of the HS/MV/HV type. The substrate 101 may further support, in another region of that substrate, conventional CMOS transistors to form an integrated circuit of BiCMOS type which includes bipolar transistors of two or more of the HS/MV/HV type along with CMOS devices.

Specific embodiments have been described. Various alterations, modifications, and improvements will occur to those skilled in the art. In particular, the number and the order of the steps of the previously-described method may be adapted by those skilled in the art. For example, the steps of cleaning the exposed surfaces of the semiconductor regions from which the epitaxies are performed may be provided before each epitaxy step. Additional spacer structures may be provided as needed.

During the step of forming the collector region 125, only a central and/or lower portion of region 125 may be doped by selective implantation of dopant atoms. This is shown by the dopant profiles of FIGS. 18A and 18B.

It will readily occur to those skilled in the art that the previously-indicated conductivity types for the layers, regions, etc. may all be inverted.

Although an embodiment of a method where the base region 127 is made of silicon-germanium has been described, the base region 127 may also be formed by epitaxy of silicon, germanium, or another semiconductor material capable of growing by epitaxy from silicon and from which silicon can grow by epitaxy. For example, this method may be used to manufacture transistors using III-V semiconductors.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
 a single-crystal semiconductor substrate including a first collector connection region doped with a first conductivity type and a second collector connection region doped with the first conductivity type;
 a first insulating layer over the single-crystal semiconductor substrate;
 a silicon layer over the first insulating layer;
 a first opening extending through the silicon layer and the first insulating layer;
 a second opening extending through the silicon layer and the first insulating layer;
 a first bipolar transistor, comprising:
  a first semiconductor collector region doped with the first conductivity type within the first opening and resting on the single-crystal semiconductor substrate;
  a counter-doped region located inside the first semiconductor collector region and which is bounded at least on top of and below by portions of the first semiconductor collector region, the counter-doped region including both a dopant of the first conductivity type and a dopant of a second conductivity type;
  a first semiconductor base region doped with the second conductivity type on top of the first semiconductor collector region; and
  a first semiconductor emitter region doped with the first conductivity type on top of the first semiconductor base region; and
 a second bipolar transistor, comprising:
  a second semiconductor collector region doped with the first conductivity type within the second opening, lacking a counter-doped region and resting on the single-crystal semiconductor substrate;
  a second semiconductor base region doped with the second conductivity type on top of the second semiconductor collector region; and
  a second semiconductor emitter region doped with the first conductivity type on top of the second semiconductor base region.

2. The integrated circuit of claim 1, wherein the first bipolar transistor which includes the counter-doped region is a medium voltage (MV) or high voltage (HV) type of device and the second bipolar transistor which does not include the counter-doped region is a high speed (HS) type of device.

3. An integrated circuit, comprising:
a single-crystal semiconductor substrate including a first collector connection region doped with a first conductivity type and a second collector connection region doped with the first conductivity type;
a first insulating layer over the single-crystal semiconductor substrate;
a silicon layer over the first insulating layer;
a first opening extending through the silicon layer and the first insulating layer;
a second opening extending through the silicon layer and the first insulating layer;
a first bipolar transistor, comprising:
    a first semiconductor collector region doped with the first conductivity type within the first opening and resting on the single-crystal semiconductor substrate;
    a first counter-doped region located inside the first semiconductor collector region and which is bounded at least on top of and below by portions of the first semiconductor collector region, the counter-doped region including both a dopant of the first conductivity type and a dopant of a second conductivity type opposite the first conductivity type;
    a first semiconductor base region doped with the second conductivity type on top of the first semiconductor collector region; and
    a first semiconductor emitter region doped with the first conductivity type on top of the first semiconductor base region; and
a second bipolar transistor, comprising:
    a second semiconductor collector region doped with the first conductivity type within the second opening and resting on the single-crystal semiconductor substrate;
    a second counter-doped region located inside the second semiconductor collector region and which is bounded at least on top of and below by portions of the second semiconductor collector region, the counter-doped region including both a dopant of the first conductivity type and a dopant of a second conductivity type;
    a second semiconductor base region doped with the second conductivity type on top of the second semiconductor collector region; and
    a second semiconductor emitter region doped with the first conductivity type on top of the second semiconductor base region.

4. The integrated circuit of claim 3, wherein the first bipolar transistor which includes the first counter-doped region is a medium voltage (MV) type of device and wherein the second bipolar transistor which includes the second counter-doped region is a high voltage (HV) type of device.

5. The integrated circuit of claim 4, wherein a dose of the second conductivity type in the first counter-doped region differs from a dose of the second conductivity type in the second counter-doped region.

6. The integrated circuit of claim 4, wherein an energy of implantation for the second conductivity type in the first counter-doped region differs from an energy of implantation for the second conductivity type in the second counter-doped region.

7. A bipolar transistor, comprising:
a single-crystal semiconductor substrate including a collector connection region doped with a first conductivity type;
a first insulating layer over the single-crystal semiconductor substrate;
a silicon layer over the first insulating layer;
an opening extending through the silicon layer and the first insulating layer;
a semiconductor collector region doped with the first conductivity type within the opening and resting on the single-crystal semiconductor substrate;
a counter-doped region located inside the semiconductor collector region and which is bounded at least on top of and below by portions of the semiconductor collector region, the counter-doped region including both a dopant of the first conductivity type and a dopant of a second conductivity type opposite the first conductivity type;
a semiconductor base region doped with the second conductivity type on top of the semiconductor collector region; and
a semiconductor emitter region doped with the first conductivity type on top of the semiconductor base region.

8. The bipolar transistor of claim 7, wherein the first conductivity type is N type and the second conductivity type is P type.

9. The bipolar transistor of claim 7, further including an insulating region that laterally insulates the semiconductor collector region from the silicon layer.

10. The bipolar transistor of claim 9, wherein the insulating region comprises an insulating material layer on sidewalls of the opening.

11. The bipolar transistor of claim 9, wherein the insulating region comprises an air spacer between a side of the semiconductor collector region and a side of the silicon layer.

12. The bipolar transistor of claim 7, further including:
a stack of layers over the silicon layer; and
a base contact region extending from a side wall of the semiconductor base region between two insulating layers of said stack.

13. The bipolar transistor of claim 12, wherein said base contact region includes a first single crystal portion extending from the side wall of the semiconductor base region and a second single crystal portion extending from a top of the silicon layer.

14. The bipolar transistor of claim 12, wherein said base contact region includes a single crystal portion extending from the side wall of the semiconductor base region and a non-single crystal portion extending from a top of the silicon layer.

15. The bipolar transistor of claim 7, further comprising:
a silicide layer at a top surface portion of each of the single-crystal silicon substrate, the base contact region and the emitter region;
a premetallization dielectric layer; and
metal contacts extending through the premetallization dielectric layer to reach each silicide layer.

16. The bipolar transistor of claim 7, wherein the single-crystal silicon substrate, first insulating layer and silicon layer form a silicon on insulator (SOI) type substrate.

17. The bipolar transistor of claim 7, wherein the silicon layer is a single-crystal silicon layer.

18. The bipolar transistor of claim 17, wherein the silicon layer is doped with the second conductivity type.

19. The bipolar transistor of claim 7, wherein the semiconductor collector region is made of a silicon material.

20. The bipolar transistor of claim 7, wherein the semiconductor base region is made of a silicon-germanium material.

21. The bipolar transistor of claim 7, wherein the semiconductor emitter region is made of a silicon material.

22. The bipolar transistor of claim 7, wherein the semiconductor base region includes a first portion doped with the second conductivity type and a second portion that is undoped.

23. The bipolar transistor of claim 7, wherein a maximum dopant concentration of the first conductivity type in the semiconductor collector region is $10^{20}$ at/cm$^3$ and a maximum dopant concentration of the second conductivity type in the counter-doped region is $10^{19}$ at/cm$^3$.

* * * * *